United States Patent
bin Mohamed Hassan

(10) Patent No.: US 6,897,645 B2
(45) Date of Patent: May 24, 2005

(54) DOCKING SYSTEM AND METHOD FOR DOCKING IN AUTOMATED TESTING SYSTEMS

(75) Inventor: Lokman bin Mohamed Hassan, Singapore (SG)

(73) Assignee: Vincent Hing Chung So, San Francisco, CA (US)

( * ) Notice: Subject to any disclaimer, the term of this patent is extended or adjusted under 35 U.S.C. 154(b) by 207 days.

(21) Appl. No.: 10/037,707

(22) Filed: Dec. 29, 2001

(65) Prior Publication Data

US 2003/0122536 A1 Jul. 3, 2003

(51) Int. Cl.⁷ ............................ G01R 1/04; G01R 31/26
(52) U.S. Cl. ...................................... 324/158.1; 324/765
(58) Field of Search ................................. 324/754–755, 324/760–765, 158.1; 73/865.8, 866.5; 414/590

(56) References Cited

U.S. PATENT DOCUMENTS

| | | | |
|---|---|---|---|
| 4,589,815 A | | 5/1986 | Smith |
| 5,068,601 A | * | 11/1991 | Parmenter .................... 324/754 |
| 5,552,701 A | * | 9/1996 | Veteran et al. ............ 324/158.1 |
| 5,600,258 A | * | 2/1997 | Graham et al. .............. 324/758 |
| 5,608,334 A | * | 3/1997 | Holt ............................ 324/758 |
| 5,923,180 A | * | 7/1999 | Botka et al. ................. 324/758 |
| 5,966,023 A | * | 10/1999 | Burgers et al. .............. 324/761 |
| 6,271,658 B1 | * | 8/2001 | Vallinan et al. ........... 324/158.1 |
| 6,304,092 B1 | * | 10/2001 | Jordan ......................... 324/758 |
| 6,333,637 B1 | * | 12/2001 | Bunzey et al. ............... 324/761 |
| 6,407,541 B1 | * | 6/2002 | Hannan et al. ........... 324/158.1 |
| 6,580,283 B1 | * | 6/2003 | Carbone et al. ............. 324/760 |
| 6,586,925 B2 | * | 7/2003 | Ramesh et al. ........... 324/158.1 |

* cited by examiner

*Primary Examiner*—Vinh Nguyen
*Assistant Examiner*—Jermele Hollington
(74) *Attorney, Agent, or Firm*—Lawrence Y.D. Ho & Assoc.

(57) ABSTRACT

A docking system (10) and method for docking a test head (16) of a device tester to a device handler. The docking system (10) has a handler plate (12) and a tester plate (14), respectively mountable to the device handler and the test head (16). The handler plate (12) has two conversion bars (18a, 18b). Each of the two conversion bars (18a,18b) has two lateral protrusions (40a,40b). The tester plate (140 has four slot mounts (26a,26b,26c,26d), each with an escalating slot (50) that is laterally oriented for respective linear engagement with the lateral protrusions (40a,40b) for the docking. The method involves making a quick alignment of the handler plate (12) to the tester plate (14) by inserting two pre-docking guide pins into (20a,20b) two pin sockets (22a,22b) and, thereafter, actuating one or both of two actuating cams (28a,28b) for the respective linear engagement.

17 Claims, 5 Drawing Sheets

DOCKING SYSTEM AND METHOD FOR DOCKING IN AUTOMATED TESTING SYSTEMS

FIELD OF THE INVENTION

The present invention relates to automated testing of electronic devices such as integrated circuits and circuit assemblies. In particular, this invention relates to a docking system and method for docking in automated testing systems.

BACKGROUND OF THE INVENTION

Electronic functional testing of electronic devices such as integrated circuits (ICs) or circuit assemblies is typically performed by automated testing systems. Generally, such automated testing systems interface with device handlers that convey the ICs or circuit assemblies to positions for testing.

In positioning an electronic device for testing, a test head of an automated testing system is connected to a test position associated with a device handler. The procedure of connecting to the test position is known in the art as docking. Docking requires an alignment of the test head to the test position and, thereafter, locking the test head to the device handler at the test position. Thus locked, a secured test position is obtained to thereby enable consistent and repeatable test results.

Generally, electronic devices that operate at high frequencies are tested with test signals of similar frequencies. Consequently, to alleviate undesired signals at these high frequencies, electronic test circuits of automated testing systems are ideally located as close as possible to the electronic devices. Hence, test heads for such automatic testing systems are densely packaged with these electronic test circuits in close proximity to the electronic devices that are to be tested.

Dense packing of electronic test circuits on a test head makes the test head bulky and heavy. Manipulating or positioning such a test head is not easy and, generally, an operator has to use a manipulating or positioning apparatus to align and then lock a test head to a test position. This can be a problem as any undesired movement, even in the millimeter range, can cause misalignment in the positioning of electronic devices. Such misalignment leads to incorrect or improper testing of the electronic devices or, in extreme situations, damage to the test head.

To overcome the delicate procedure of test head alignment, U.S. Pat. No. 6,271,658 B1 Vallinan et al., assigned to ST Assembly Test Services Pte. Ltd., describes a docking system having two plates, one attached to a device handler and the other to a device tester. Each of the two test plates has a substructure that allows for an easier initial alignment between the two plates and, thereafter, securely positioning and interlocking a handler plate with a test head. In another related prior art, U.S. Pat. No. 6,304,092 B1 Jordan, assigned to Credence Systems Corporation, describes two docking bars that enable a test head to dock with a wafer prober without requiring a calibration bar.

However, existing docking systems described, for example, in U.S. Pat. No. 6,271,658 and U.S. Pat. No. 6,304,092, are not designed to allow variations in the separation between the two plates without having to modify, for example, at least one of the two docking bars or one of the two test plates. Furthermore, elements or features of such existing docking systems do not enable the use of automated docking mechanisms. Consequently, human operators are still needed to manipulate or to position test heads in such existing docking systems. In addition, cable wires in the docking system described in U.S. Pat. No. 6,271,658 can be a problem as, over time, such cable wires slacken through use and, therefore, affect docking accuracy.

Therefore, a need clearly exists for a docking system that enables test heads of automated test systems from different test systems manufacturers to be connected to device handlers of different device handler manufacturers. Furthermore, the docking system should have features that enable the use of automated docking mechanisms to thereby alleviate the need for human operators.

BRIEF SUMMARY OF THE INVENTION

The present invention seeks to provide a docking system and method for docking a test head of a device tester to a device handler.

Accordingly, in one aspect, the present invention provides a docking system for docking a test head of a device tester to a device handler, the docking system comprising:
 a handler plate, mountable to the device handler and comprising at least one conversion bar, each of the at least one conversion bar comprising at least one lateral protrusion;
 and
 a tester plate, mountable to the test head and comprising at least one slot mount, each of the at least one slot mount having an escalating slot, the escalating slot being laterally oriented for respective linear engagement with the at least one lateral protrusion for the docking.

In another aspect, the present invention provides a docking system for docking a test head of a device tester to a device handler, the docking system comprising:
 a handler plate:
 a tester plate;
 and
 a coupling assembly for enabling the docking, the coupling assembly being associated with the handler plate and the tester plate and comprising:
  at least one conversion bar, each of the at least one conversion bar comprising at least one lateral protrusion;
  at least one slot mount, each of the at least one slot mount having an escalating slot, the escalating slot being laterally oriented for respective linear engagement with the at least one lateral protrusion;
  and
  a cam assembly, coupled to the at least one slot mount, for enabling the respective linear engagement when actuated.

In a further aspect, the present invention provides, in an automated testing system, a method for docking a handler plate to a tester plate, the tester plate being coupled to a test head of a device tester, the handler plate being coupled to a device handler, the method comprising the steps of:
 aligning the handler plate to the tester plate using at least one pre-docking guide pin, the at least one pre-docking guide pin being mountable to the handler plate and respectively engageable with at least one pin socket, the at least one pin socket being associated with the tester plate;
 and
 actuating at least one actuating cam associated with the tester plate to thereby enable respective linear engagement of at least one escalating slot of the tester plate with at least one lateral protrusion for the docking, the at least one lateral protrusion being associated with each of at least one conversion bar, the at least one conversion bar being mounted to the handler plate.

BRIEF DESCRIPTION OF THE DRAWINGS

A preferred embodiment of the present invention will now be more fully described, by way of example, with reference to the drawings of which.

DETAILED DESCRIPTION OF THE DRAWINGS

A docking system and a method for docking a test head of a device tester to a device handler in accordance with the preferred embodiment of the present invention are described. In the following description, details are provided to describe the preferred embodiment. It shall be apparent to one skilled in the art, however, that the invention may be practiced without such details. Some of these details may not be described at length so as not to obscure the invention.

There are many advantages of the preferred embodiment of the present invention. One advantage of the preferred embodiment is that slot mounts with escalating slots are used to dock a handler plate to a tester plate. The escalating slots enable a gradual docking between the handler plate and the tester plate. Such gradual docking alleviates damaging either plates due to undesired movement.

Another advantage of the preferred embodiment is that the slot mounts are respectively coupled with linear guides that maintain linearity during the gradual docking. These linear guides also alleviate friction at contact surfaces between the slot mounts and the tester plate.

A further advantage of the preferred embodiment is that the docking system provides a conversion bar that is designed to allow variations in the separation between the handler plate and the tester plate. Hence, such variations do not require modifications to the handler plate or the tester plate.

Yet another advantage of the preferred embodiment is that the docking system has a cam assembly that couples to the slot mounts using coupling rods instead of cable wires. Such coupling rods are more durable and are less likely to slacken through use over time.

Still another advantage of the preferred embodiment is that pre-docking guide pins are used for a quick alignment of the handler plate to the tester plate before finer adjustments are made for docking both plates to each other.

Figure 1:
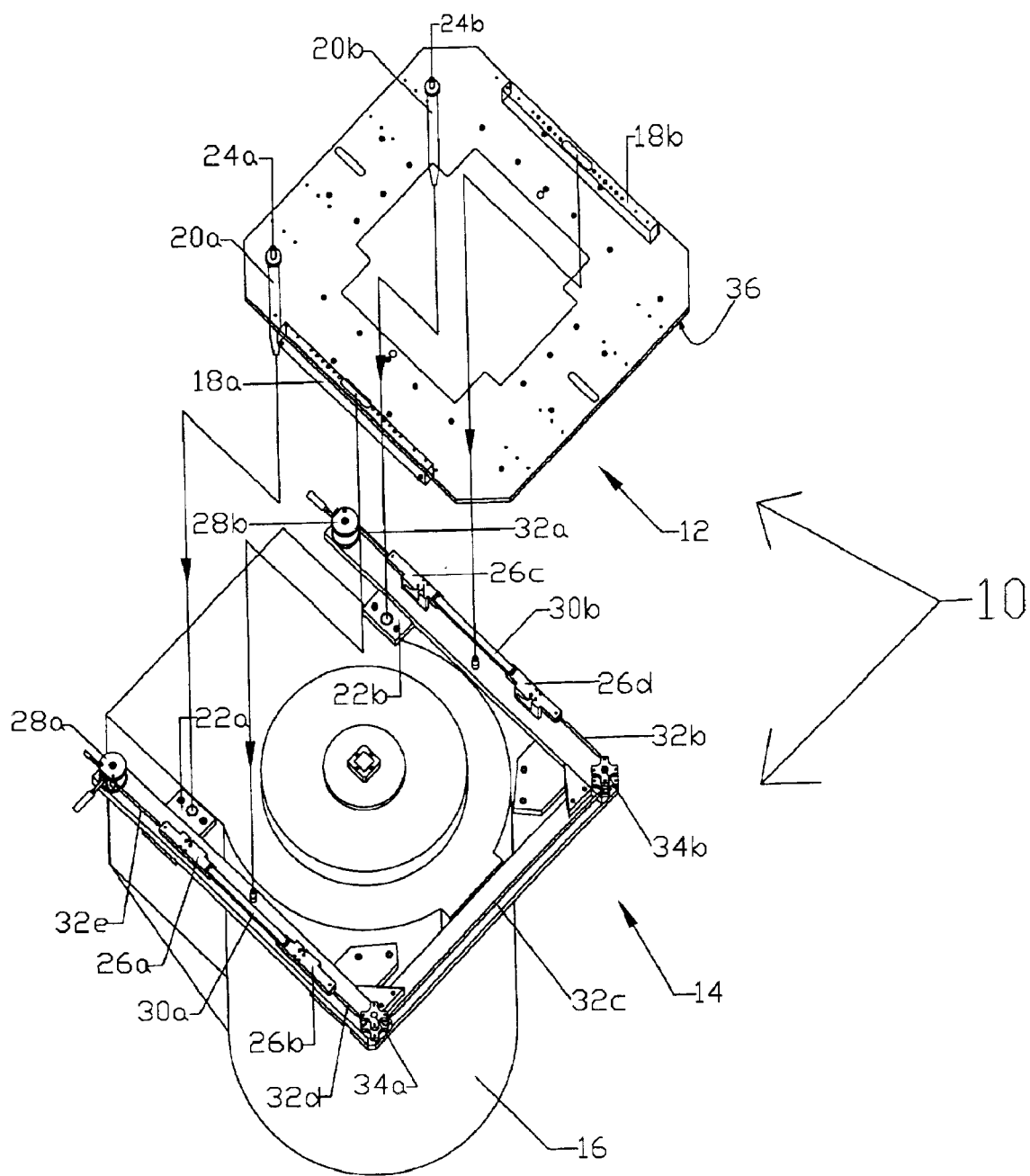
FIG. 1 is an exploded perspective view of a docking system comprising a handler plate and a tester plate in accordance with the preferred embodiment.

Referring now to FIG. 1, an exploded perspective view of a docking system 10 comprising a handler plate 12 and a tester plate 14 in accordance with the preferred embodiment of the present invention is shown. The tester plate 14 is shown mounted to a test head 16 of an automated testing system (not shown).

Mounted to the handler plate 12 are two conversion bars 18a,18b and two pre-docking guide pins 20a,20b. When the handler plate 12 is mounted to a device handler (not shown), the two pre-docking guide pins 20a,20b enable a quick alignment of the handler plate 12 to the tester plate 14 prior to docking. For the quick alignment, the tester plate 14 has two pin sockets 22a,22b for respectively inserting the two pre-docking guide pins 20a,20b.

The handler plate 12 has a plurality of predetermined guide pin positions at which the two pre-docking guide pins 20a,20b can be mounted. Two predetermined guide pin positions 24a,24b that are used to mount the two pre-docking guide pins 20a,20b are indicated. The plurality of predetermined guide pin positions allows for the docking system 10 to be mountable to test heads of different automated testing systems.

The tester plate 14 comprises four slot mounts 26a,26b, 26c,26d coupled to each other by a cam assembly. The cam assembly comprises two actuating cams 28a,28b, two link bars 30a,30b, five coupling rods 32a,32b,32c,32d,32e and two interconnecting cams 34a,34b.

Figure 2:
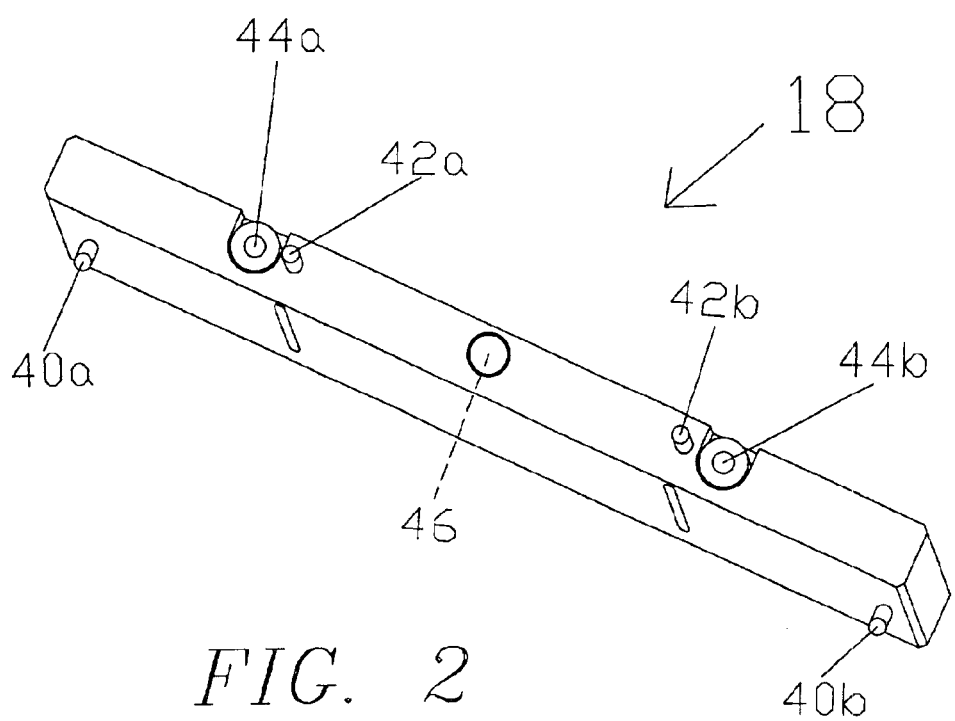
FIG. 2 is a perspective view of a conversion bar that is mountable to the handler plate of FIG. 1.
Figure 3:
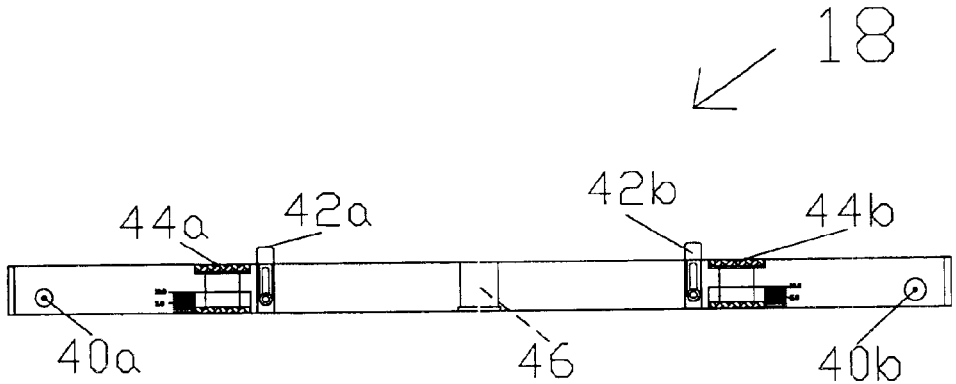
FIG. 3 is a side view of the conversion bar of FIG. 2.

Referring now to FIG. 2 and FIG. 3, each of the two conversion bars 18a,18b comprises two lateral protrusions 40a,40b. The two conversion bars 18a,18b are designed to allow variations in separation between the handler plate 12 and the tester plate 14. Such variations depend on datum positions, including reference positions, of different automated testing systems because of, for example, different socket pitches of integrated circuits or different load or performance board stack height.

In addition, each of the two conversion bars 18a,18b further comprises two reference locating pins 42a,42b, two adjustable screw spacers 44a,44b and an aperture reference 46. The two adjustable screw spacers 44a,44b can be implemented using bolts and nuts to adjust position of the two conversion bars 18a,18b relative to a surface 36 of the handler plate 12. In adjusting this position, the separation between the handler plate 12 and the tester plate 14 can be varied accordingly.

Figure 4:
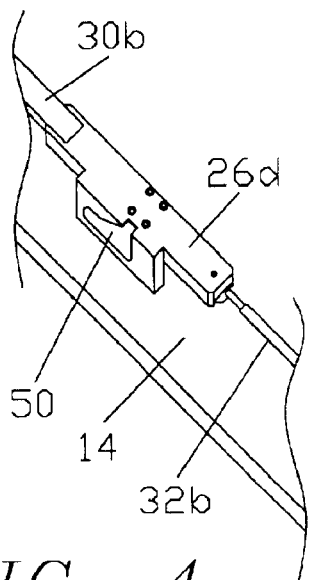
FIG. 4 is a perspective view of a part of the tester plate of FIG. 1 illustrating a slot mount.

FIG. 4 is a perspective view of a part of the tester plate 14 illustrating the slot mount 26d that is coupled to end portions of the link bar 30b and the coupling rod 32b. The slot mount 26d has an escalating slot 50 that is laterally oriented for respective linear engagement with one of the two lateral protrusions 40 of a conversion bar 18.

Figure 5:
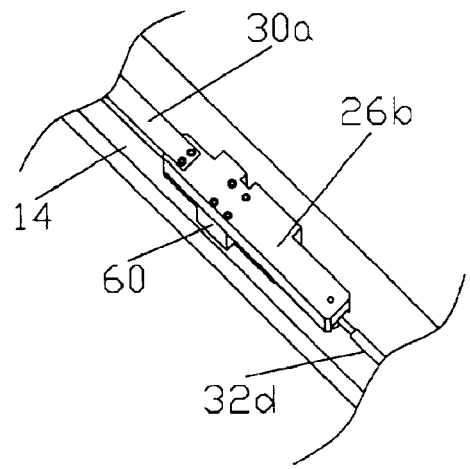
FIG. 5 is a perspective view of another part of the tester plate of FIG. 1 showing the position of a linear guide coupled to a slot mount.
Figure 6:
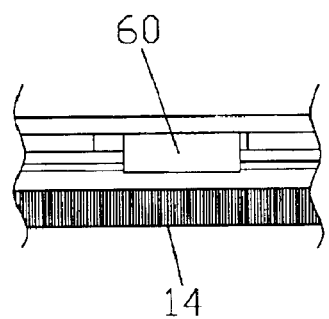
FIG. 6 is a side view of the part of FIG. 5.

FIG. 5 is a perspective view of another part of the tester plate 14 showing the position of a linear guide 60 of the tester plate 14 that is coupled to the slot mount 26b. Each of the four slot mounts 26a,26b,26c,26d is coupled with such a linear guide 60. The linear guide 60 maintains linearity during relative movement of the handler plate 12 and the tester plate 14 during docking. The linear guide 60 has a bearing contact to alleviate friction at contact surfaces between a slot mount 26 and the tester plate 14. FIG. 6 is a side view of the part of FIG. 5 showing positions of the linear guide 60 and contact between the bearing contact and the tester plate 14.

Figure 7:
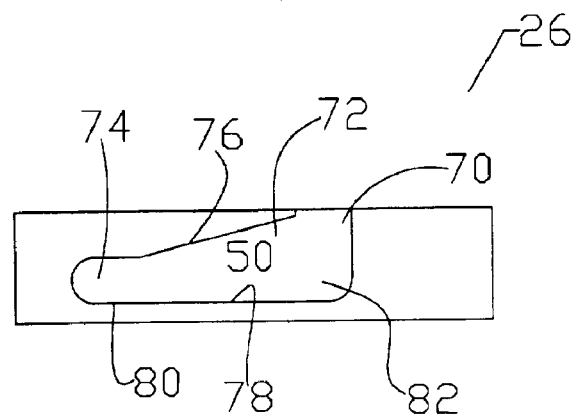
FIG. 7 is a side view of the slot mount of FIG. 4.

FIG. 7 is a side view of the part of FIG. 4 showing details of an escalating slot 50. Upon an initial alignment of the handler plate 12 to the tester plate 14, a lateral protrusion 40 (not shown) is positioned at an unbounded perimeter portion 70 of the escalating slot 50. Thereafter, respective linear engagement of the lateral protrusion 40 with the escalating slot 50 begins when one or both the actuating cams 28a,28b are actuated.

The escalating slot 50 comprises a tapered section 72 and a docking section 74. The tapered section 72 comprises a linear sloping edge 76 and a linear non-sloping edge 78. The linear non-sloping edge 78 is linearly aligned with a linear docking edge 80 of the docking section 74. The tapered section 72 comprises a connecting portion 82 for enabling substantially linear movement of the lateral protrusion 40 from the unbounded perimeter portion 70 to the linear non-sloping edge 78.

Figure 8:
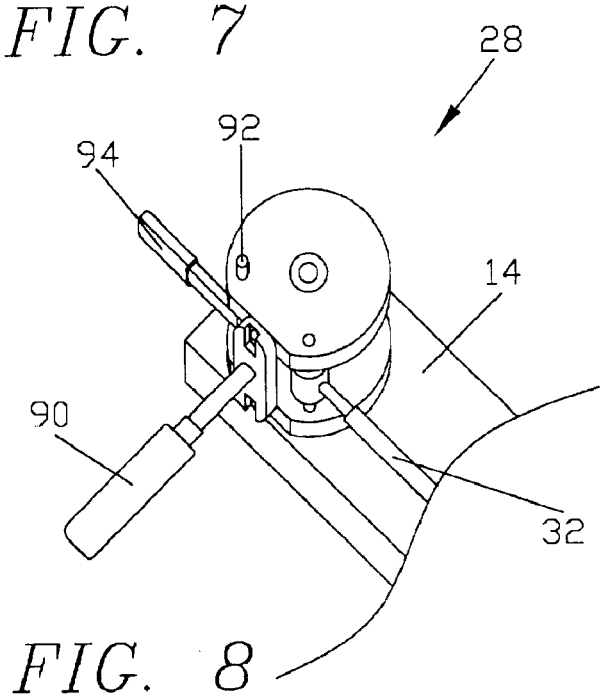
FIG. 8 is a perspective view of an actuating cam of the tester plate of FIG. 1.

FIG. 8 is a perspective view of an actuating cam 28 of the tester plate 14. The actuating cam 28 has a cam handle 90. Moving the cam handle 90 moves the coupling rod 32 such that the escalating slot 50 gradually engages the lateral protrusion 40 along the linear sloping edge 76 of the tapered section 72. Movement of the lateral protrusion 40 relative to and within the escalating slot 50 can be effected in this manner until the lateral protrusion 40 is positioned at the docking section 74.

In turning the cam handle 90 of one or both the actuating cams 28a,28b, a slot mount 26 is pulled to linearly engage a lateral protrusion 40. Within the tapered section 72 of the slot mount 26, movement of the lateral protrusion 40 is guided along the linear sloping edge towards the docking section 74. As such, the handler plate 12 and the tester plate 14 are gradually brought closer to attain a datum position when docked.

Figure 9:
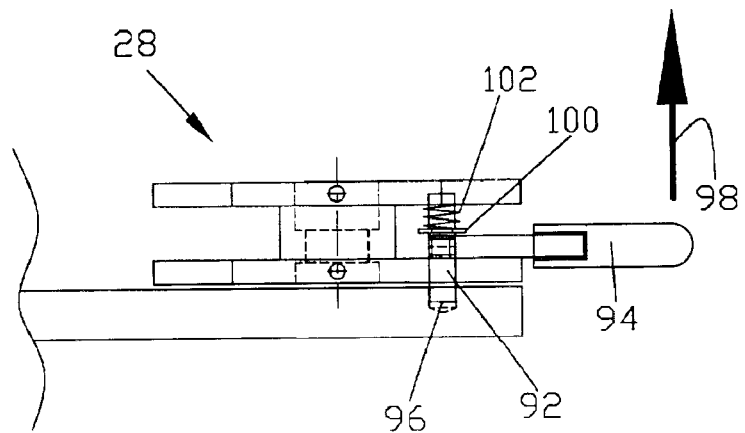
FIG. 9 is a side view of the actuating cam of FIG. 8.

A self-locking pin 92 is provided to lock the actuating cam 28a in a locking position at which the lateral protrusion 40 is retained within the docking section 74. The self-locking pin 92 can be unlocked by moving a latch handle 94 that releases the self-locking pin 92 from the locking position. FIG. 9 is a side view of the actuating cam 28 to illustrate operations of the locking pin 92 and the latch handle 94. A lock pin aperture 96 receives the self-locking pin 92 at the locking position. Moving the latch handle 94 in a direction indicated with an arrow 98 releases a retaining clip 100 and compresses a lock spring 102 to thereby release the self-locking pin 92 from the lock pin aperture 96.

Other than manually actuating the actuating cams 28, the datum position can also be attained by automated control of the docking. This is because automation mechanisms typically operate based upon linear movement and the connecting portion 82 enables substantially linear movement of the lateral protrusion 40 from the unbounded perimeter portion 70 to the linear non-sloping edge 78. As such, the datum position is attainable for the docking system 10 by an automation mechanism (not shown) using just one degree of freedom associated with the linear movement.

Figure 10:
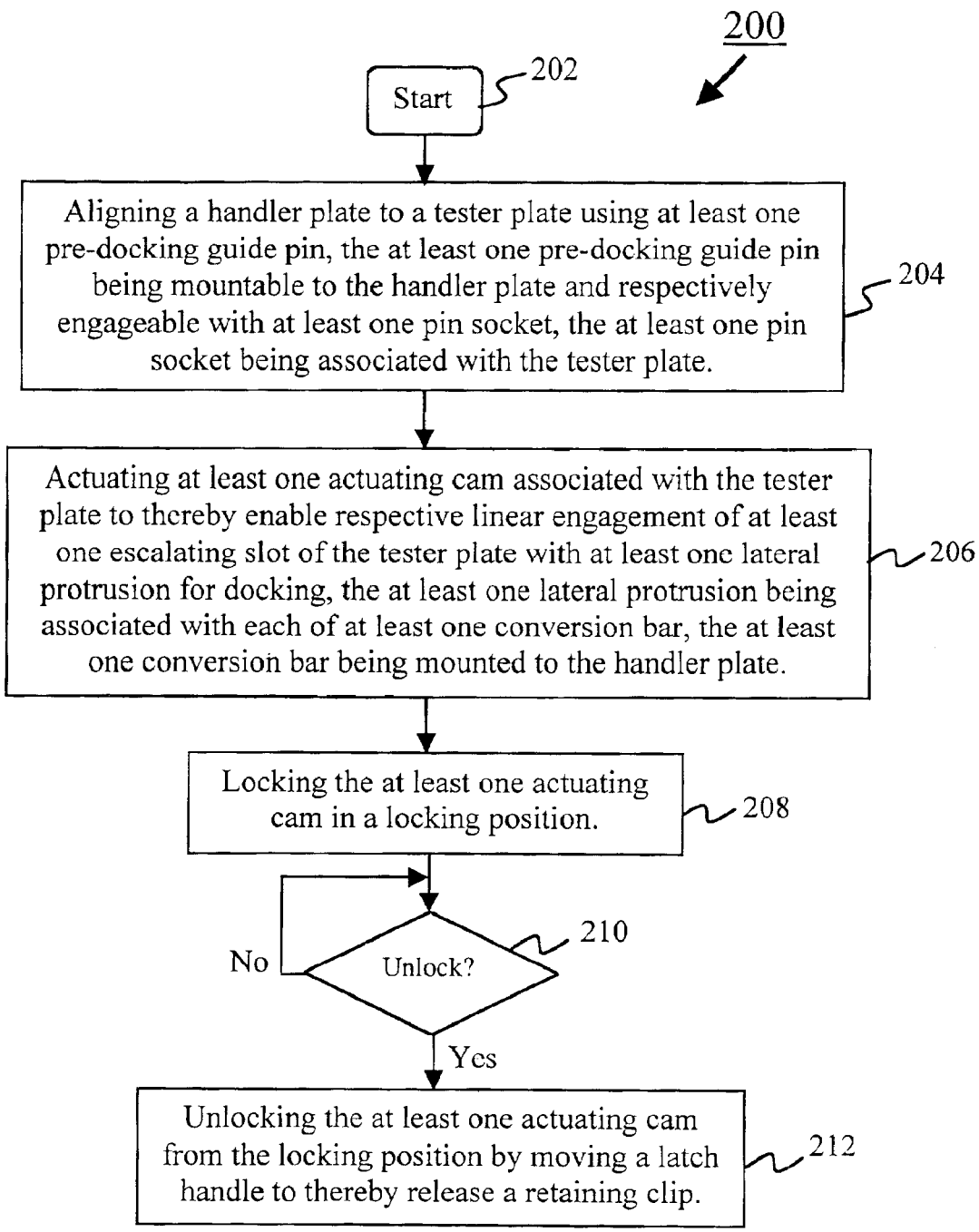
FIG. 10 is a flow chart of a method for docking the handler plate and the tester plate of the docking system of FIG. 1.

FIG. 10 is a flow chart of a method 200 for docking the handler plate 12 and the tester plate 14 of the docking system 10.

The method 200 begins at step 202 and proceeds to an aligning step 204. In the aligning step 204, the handler plate 12 is aligned to the tester plate 14 using the two pre-docking guide pins 20a,20b. As described in the above, the two pre-docking guide pins 20a,20b is mountable to the handler plate 12 and respectively engageable with the two pin sockets 22a,22b that are associated with the tester plate 14.

In aligning the handler plate 12 and the tester plate 14, each of the lateral protrusions 40a,40b of the two conversion bars 18a,18b are positioned, respectively, at the unbounded perimeter portion 70 of the escalating slot 50 of the four slot mounts 26a,26b,26c,26d.

Thereafter, the method 200 proceeds to an actuating step 206 during which at least one of the two actuating cams 28a,28b are actuated. As both the two actuating cams 28a,28b are coupled to each other, actuation of at least one of the two actuating cams 28a,28b causes the other actuating cam 28a,28b to be similarly actuated. Consequently, respective linear engagement of the escalating slot 50 of each of the four slot mounts 26a,26b,26c,26d of the tester plate 14 with the lateral protrusions 40a,40b of the two conversion bars 18a,18b for the docking is thereby enabled.

The method 200 then continues to a locking step 208 at which one or both the two actuating cams 28a,28b are locked in a locking position. In this locking position, the retaining clip 100 retains the self-locking pin 92 within the lock pin aperture 96. Consequently, the actuating cam 28 is prevented from being actuated to disengage the handler plate 12 from the tester plate 14.

The method 200 provides a decision step 210 at which a determination is made whether to unlock an actuating cam 28, which has been locked at the locking step 208, from the locking position. With a 'No' at the decision step 210, the actuating cam 28 remains locked in the locking position. Otherwise, with a 'Yes' at the decision step 210, the method 200 proceeds to an unlocking step 212.

At the unlocking step 212, a locked actuating cam 28 is unlocked by moving the latch handle 94 in the direction indicated with the arrow 98 to thereby release the retaining clip 100. As described in the above, moving the latch handle 94 in that direction also compresses the lock spring 102 to thereby release the self-locking pin 92 from the lock pin aperture 96.

It will be appreciated that although one preferred embodiment has been described in detail, persons skilled in the art can make various modifications and improvements without departing from the scope of the present invention.

What is claimed is:

1. A docking system for docking a test head of a device tester to a device handler, said docking system comprising:

a handler plate, mountable to said device handler and comprising at least one conversion bar, each of said at least one conversion bar comprising at least one lateral protrusion;

and a tester plate, mountable to said test head and comprising at least one slot mount, each of said at least one slot mount having an escalating slot, said escalating slot being laterally oriented for respective linear engagement with said at least one lateral protrusion for said docking;

wherein said escalating slot comprises a tapered section, a docking section and an unbound perimeter portion, said tapered section comprises a linear sloping edge and a linear non-sloping edge, and said docking section comprises a curved edge connecting to the linear sloping edge and a linear docking edge being linearly aligned with said linear non-sloping edge; thereby said at least one lateral protrusion is enabled to move linearly to the docking section along the linear sloping edge;

wherein said tapered section further comprises a connecting portion for connecting the unbounded perimeter portion and the linear non-sloping edge of the tapered section so enabling substantially linear movement of said at least one lateral protrusion from said unbounded perimeter portion to said linear non-sloping edge and then to the linear docking edge along the linear non-sloping edge;

thereby said escalating slot enables the docking system to be operable both manually and automatically.

2. The docking system as claimed in claim 1, wherein said tester plate further comprises a cam assembly, coupled to said at least one slot mount, for enabling said respective linear engagement when actuated.

3. The docking system as claimed in claim 2, wherein said cam assembly comprises at least one actuating cam.

4. The docking system as claimed in claim 2, wherein said cam assembly comprises at least one coupling rod.

5. The docking system as claimed in claim 2, wherein said cam assembly comprises at least one interconnecting cam.

6. The docking system as claimed in claim 1, wherein said tester plate further comprises at least one linear guide; said at least one slot mount being respectively coupled with said at least one linear guide.

7. The docking system as claimed in claim 1, wherein each of said at least one conversion bar further comprises at least one reference locating pin.

8. The docking system as claimed in claim 1, wherein each of said at least one conversion bar further comprises at least one adjustable screw spacer.

9. The docking system as claimed in claim 1, and further comprising at least one pro-docking guide pin, mountable to at leant one predetermined guide pin position of said handler plate.

10. A docking system for docking a test head of a device tester to a device handler, said docking system comprising:

a handler plate;

a tester plate;

and a coupling assembly for enabling said docking, said coupling assembly being associated with said handler plate and said tester plate and comprising:
at least one conversion bar, each of said at least conversion bar comprising at least one lateral protrusion;
at least one slot mount, each of said at least one slot mount having an escalating slot, said escalating slot being laterally oriented for respective linear engagement with said at least one lateral protrusion;
and
a cam assembly, coupled to said at least one slot mount, for enabling said respective linear engagement when actuated;

wherein said escalating slot comprises a tapered section, a docking section and an unbound perimeter portion, said tapered section comprises a linear sloping edge and a linear non-sloping edge, and maid docking section comprises a curved edge connecting to the linear sloping edge and a linear docking edge being linearly aligned with said linear non-sloping edge; thereby said at last one lateral protrusion is enabled to move linearly to the docking section along the linear sloping edge; and wherein said tapered section further comprises a connecting portion for connecting the unbounded perimeter portion and the linear non-sloping edge of the tapered section so enabling substantially linear movement of said at least one lateral protrusion from said unbounded perimeter portion to said linear non-sloping edge and then to the linear docking edge alone the linear non-sloping edge;

thereby said escalating slot enables the docking system to be operable both manually and automatically.

11. The docking system as claimed in claim 10, wherein said cam assembly comprises at least one actuating cam.

12. The docking system as claimed in claim 10, wherein said cam assembly comprises at least one coupling rod.

13. The docking system as claimed in claim 10, wherein said cam assembly comprises at least one interconnecting cam.

14. The docking system as claimed in claim 10, wherein said tester plate further comprises at least one linear guide, said at least one slot mount being respectively coupled with said at least one linear guide.

15. The docking system as claimed in claim 10, wherein each of said at least one conversion bar further comprises at least one reference locating pin.

16. The docking system as claimed in claim 10, wherein each of said at least one conversion bar further comprises at least one adjustable screw spacer.

17. The docking system as claimed in claim 10, and further comprising at least one pre-docking guide pin, mountable to at least one predetermined guide pin position of said handler plate.

* * * * *